United States Patent
Lin et al.

(10) Patent No.: US 9,653,382 B2
(45) Date of Patent: May 16, 2017

(54) SEMICONDUCTOR LASER STRUCTURE

(71) Applicant: Industrial Technology Research Institute, Hsinchu (TW)

(72) Inventors: Jui-Ying Lin, Hsinchu County (TW); Yen-Hsiang Fang, New Taipei (TW); Chia-Hsin Chao, Taichung (TW); Yao-Jun Tsai, Taoyuan County (TW); Yi-Chen Lin, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/864,810

(22) Filed: Sep. 24, 2015

(65) Prior Publication Data

US 2016/0020578 A1  Jan. 21, 2016

Related U.S. Application Data

(62) Division of application No. 14/472,400, filed on Aug. 29, 2014, now Pat. No. 9,171,779.

(Continued)

(51) Int. Cl.
  *H01S 5/024* (2006.01)
  *H01S 5/026* (2006.01)
  (Continued)

(52) U.S. Cl.
  CPC ............ *H01L 23/481* (2013.01); *G02B 6/12* (2013.01); *G02B 6/34* (2013.01); *H01L 21/30604* (2013.01); *H01L 21/486* (2013.01); *H01L 21/76898* (2013.01); *H01L 23/13* (2013.01); *H01L 23/147* (2013.01); *H01L 23/49827* (2013.01); *H01L 23/60* (2013.01);
  (Continued)

(58) Field of Classification Search
  CPC ...... H01S 5/021; H01S 5/02469; H01S 5/026; H01S 5/1032; H01S 5/1028; H01S 5/02228
  See application file for complete search history.

(56) References Cited

U.S. PATENT DOCUMENTS 5,226,052 A * 7/1993 Tanaka ................ H01S 5/02248
                                              257/100
7,639,719 B2 * 12/2009 Fang ........................ H01S 5/024
                                              257/712

(Continued)

*Primary Examiner* — Michael Carter
(74) *Attorney, Agent, or Firm* — Jianq Chyun IP Office

(57) ABSTRACT

A semiconductor laser structure is provided. The semiconductor laser comprises a central thermal shunt, a ring shaped silicon waveguide, a contiguous thermal shunt, an adhesive layer and a laser element. The central thermal shunt is located on a SOI substrate which has a buried oxide layer surrounding the central thermal shunt. The ring shaped silicon waveguide is located on the buried oxide layer and surrounds the central thermal shunt. The ring shaped silicon waveguide includes a P-N junction of a p-type material portion, an n-type material portion and a depletion region there between. The contiguous thermal shunt covers a portion of the buried oxide layer and surrounds the ring shaped silicon waveguide. The adhesive layer covers the ring shaped silicon waveguide and the buried oxide layer. The laser element covers the central thermal shunt, the adhesive layer and the contiguous thermal shunt.

12 Claims, 14 Drawing Sheets

Related U.S. Application Data

(60) Provisional application No. 61/871,319, filed on Aug. 29, 2013.

(51) Int. Cl.

| | | |
|---|---|---|
| *H01S 5/34* | (2006.01) | |
| *H01L 23/48* | (2006.01) | |
| *H01L 21/306* | (2006.01) | |
| *H01L 27/02* | (2006.01) | |
| *H01L 33/20* | (2010.01) | |
| *H01L 33/62* | (2010.01) | |
| *H01L 21/768* | (2006.01) | |
| *H01L 23/00* | (2006.01) | |
| *H01S 5/02* | (2006.01) | |
| *G02B 6/12* | (2006.01) | |
| *G02B 6/34* | (2006.01) | |
| *H01L 29/861* | (2006.01) | |
| *H01L 23/60* | (2006.01) | |
| *H01L 23/13* | (2006.01) | |
| *H01L 23/14* | (2006.01) | |
| *H01L 23/498* | (2006.01) | |
| *H01L 21/48* | (2006.01) | |
| *H01L 25/16* | (2006.01) | |

(52) U.S. Cl.
CPC .............. *H01L 24/16* (2013.01); *H01L 24/48* (2013.01); *H01L 27/0255* (2013.01); *H01L 29/861* (2013.01); *H01L 33/20* (2013.01); *H01L 33/62* (2013.01); *H01S 5/026* (2013.01); *H01S 5/0208* (2013.01); *H01S 5/02469* (2013.01); *H01S 5/34* (2013.01); *G02B 2006/12061* (2013.01); *H01L 24/05* (2013.01); *H01L 24/06* (2013.01); *H01L 24/08* (2013.01); *H01L 24/32* (2013.01); *H01L 24/80* (2013.01); *H01L 25/167* (2013.01); *H01L 2224/04* (2013.01); *H01L 2224/0401* (2013.01); *H01L 2224/04026* (2013.01); *H01L 2224/04042* (2013.01); *H01L 2224/05639* (2013.01); *H01L 2224/05644* (2013.01); *H01L 2224/05647* (2013.01); *H01L 2224/06102* (2013.01); *H01L 2224/08148* (2013.01); *H01L 2224/08238* (2013.01); *H01L 2224/16148* (2013.01); *H01L 2224/16238* (2013.01); *H01L 2224/29294* (2013.01); *H01L 2224/32148* (2013.01); *H01L 2224/32238* (2013.01); *H01L 2224/48091* (2013.01); *H01L 2224/48105* (2013.01); *H01L 2224/48148* (2013.01); *H01L 2224/48229* (2013.01); *H01L 2224/73265* (2013.01); *H01L 2224/80801* (2013.01); *H01L 2224/80805* (2013.01); *H01L 2224/81439* (2013.01); *H01L 2224/81444* (2013.01); *H01L 2224/81447* (2013.01); *H01L 2224/83439* (2013.01); *H01L 2224/83444* (2013.01); *H01L 2224/83447* (2013.01); *H01L 2224/83805* (2013.01); *H01L 2224/85439* (2013.01); *H01L 2224/85444* (2013.01); *H01L 2224/85447* (2013.01); *H01L 2924/00014* (2013.01); *H01L 2924/01322* (2013.01); *H01L 2924/12035* (2013.01); *H01L 2924/12041* (2013.01); *H01L 2924/12042* (2013.01); *H01L 2924/14* (2013.01); *H01L 2924/1434* (2013.01); *H01L 2933/0066* (2013.01)

(56) References Cited

U.S. PATENT DOCUMENTS

| | | | | |
|---|---|---|---|---|
| 2005/0175053 | A1* | 8/2005 | Kimura | H01S 5/02272 372/50.12 |
| 2005/0194606 | A1* | 9/2005 | Oohata | H01L 24/24 257/99 |
| 2007/0170417 | A1* | 7/2007 | Bowers | H01L 31/1852 257/14 |
| 2008/0095202 | A1* | 4/2008 | Yanagisawa | H01S 3/0632 372/19 |
| 2010/0111128 | A1* | 5/2010 | Qin | B82Y 20/00 372/46.01 |

* cited by examiner

SEMICONDUCTOR LASER STRUCTURE

CROSS-REFERENCE TO RELATED APPLICATION

This application is a divisional application of U.S. application Ser. No. 14/472,400 filed on Aug. 29, 2014, now allowed, which claims the priority benefits of U.S. provisional application Ser. No. 61/871,319, filed on Aug. 29, 2013. The entirety of each of the above-mentioned patent applications is hereby incorporated by reference herein and made a part of this specification.

BACKGROUND OF THE INVENTION

1. Field of the Invention

The present invention generally relates to a structure, in particular, to a semiconductor laser structure with improved heat dissipation.

2. Description of Related Art

Because of the poor thermal conductivity of the buried oxide in the silicon on insulator (SOI) substrate, serious self-heating effects are often generated in the active elements on the SOI, which has great impacts on the stability of the characteristics of the laser, including the peak wavelengths and the output power.

Improving the heat dissipation has considerable impacts on the performance of the laser. Poor heat dissipation not only lowers the power of the laser power, but also cause the wavelength shift of the laser. Especially in the field of optical communications, it is essential to have the light source of high quality and high stability as a small change in the wavelength will greatly affect the transmission of data.

SUMMARY OF THE INVENTION

The present invention provides a semiconductor laser comprising a central thermal shunt, a ring shaped silicon waveguide, a contiguous the mal shunt, an adhesive layer and a laser element. The central thermal shunt is located on a SOI substrate which has a buried oxide layer surrounding the central thermal shunt. The ring shaped silicon waveguide is located on the buried oxide layer and surrounds the central thermal shunt. The ring shaped silicon waveguide includes a P-N junction of a p-type material portion, an n-type material portion and a depletion region there between. The contiguous thermal shunt covers a portion of the buried oxide layer and surrounds the ring shaped silicon waveguide. The adhesive layer covers the ring shaped silicon waveguide and the buried oxide layer. The laser element covers the central thermal shunt, the adhesive layer and the contiguous thermal shunt.

The present invention provides a semiconductor laser structure comprising a substrate, at least one trench, an adhesive layer, a laser element and a plurality of electrodes. The substrate have a surface layer, a bottom layer and an intermediate layer sandwiched between the surface layer and the bottom layer. The trench on the substrate penetrates through the surface layer and the intermediate layer. The adhesive layer is on a top surface of the substrate and at least partly fills the trench. The laser element is disposed on the adhesive layer on the substrate. The electrodes are disposed over the substrate and on the laser element. The protection layer at least partly covers the laser element.

The present invention provides a semiconductor laser structure comprises a substrate, at least one trench, an adhesive layer, a laser element, a plurality of electrodes, a protection layer and a plurality of metal lines. The substrate have a surface layer, a bottom layer and a low thermal-resistance layer sandwiched between the surface layer and the bottom layer. The at least one trench on the substrate penetrates through the surface layer until the surface of the low thermal-resistance layer. The adhesive layer is on a top surface of the substrate and at least partly fills the trench. The laser element is disposed on the adhesive layer on the substrate. The electrodes are disposed over the substrate and on the laser element. The protection layer at least partly covers the laser element. The plurality of metal lines penetrates the protection layer and connects with the plurality of the electrodes.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
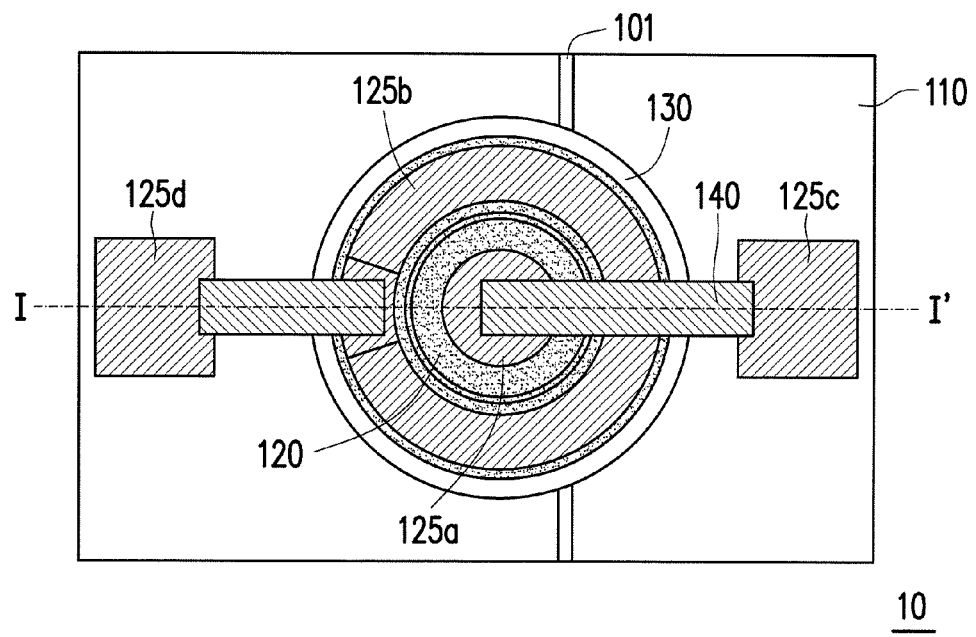
FIG. 1A is a top view of a semiconductor laser structure according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts. In the following embodiment, a circuit trace part of a portable device is described as an example for illustration. It is not intended to limit the method or the part structure by the exemplary embodiments described herein.

The present invention describes the semiconductor laser structure with improved heat dissipation by using a substrate having better heat dissipation capability, or improving the thermal path or the interface between the laser and the substrate.

Figure 1B:
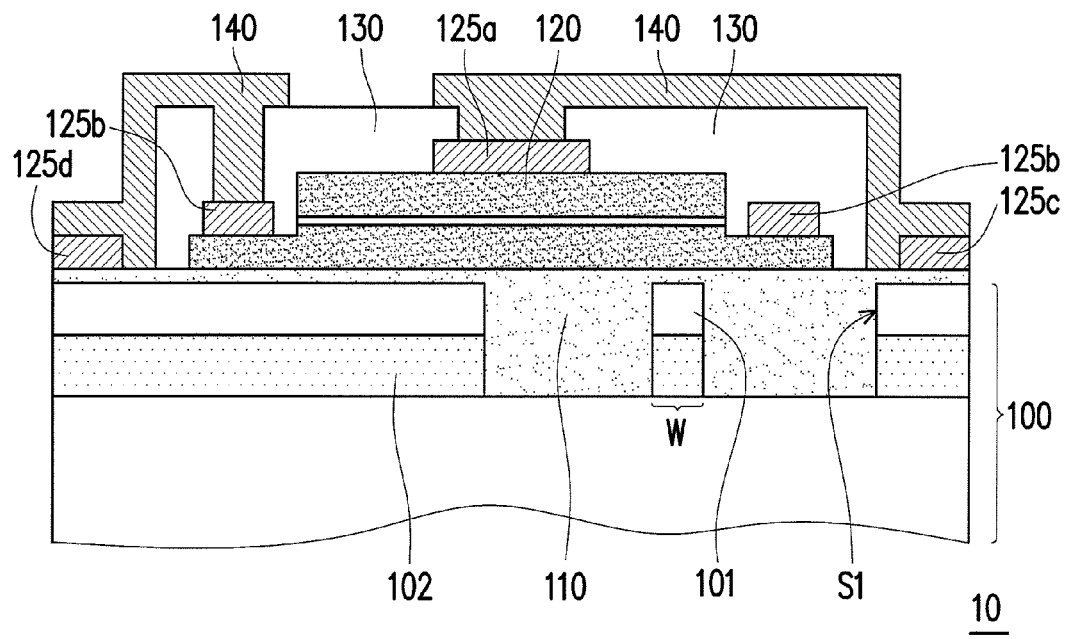
FIG. 1B is a cross-sectional view of the semiconductor laser structure of FIG. 1A.

FIG. 1A is a top view of a semiconductor laser structure according to one embodiment of the present invention. FIG. 1B is a cross-sectional view of the semiconductor laser structure of FIG. 1A along the section line IT. In FIGS. 1A-1B, the laser structure 10 includes a substrate 100, an adhesive layer 110 with a high thermal conductivity (i.e., the thermal conductive adhesive layer 110) disposed on the substrate 100, a laser element 120 located on the thermal conductive adhesive layer 110, a plurality of electrodes 125a, 125b, 125c, 125d located on the laser element 120 and on the thermal conductive adhesive layer 110 and a protection layer 130 covering the laser element 120 and the plurality of electrodes 125a, 125b, 125c, 125d. The laser structure 10 further includes at least one metal line 140 connecting the plurality of electrodes 125. The electrodes 125a and 125b are disposed on the laser element 120, while the electrodes 125c and 125d are disposed on the thermal conductive adhesive layer 110. The substrate 100 may be, a SOI substrate having a buried oxide layer 102 therein, for example. The SOI substrate includes at least one trench S1 formed therein and the trench S1 is filled up with the thermal conductive adhesive layer 110. The silicon portion 101 of the SOI substrate 100 located in the region W and above the buried oxide layer 102 functions as a silicon optical waveguide for the laser element 120. When the laser element 120 in operation, the laser signal passes through the optical path of the optical waveguide and then transmitted to other optoelectronic components.

The heat generated from the laser element 120 can dissipate through various paths, either transferring the heat through the metal line 140, to the thermal conductive adhesive layer 110 and then to the ambient environment, or directly dissipating the heat to the underlying thermal conductive adhesive layer 110 and then to the ambient environment.

The thermal conductive adhesive layer 110 may be made of a transparent adhesive layer mixed with a material of high thermal-conductivity and high light-transmittance. The transparent adhesive layer may be, for example, benzocyclobutene (BCB), and the material of high thermal-conductivity and high light-transmittance may be graphene, diamond-like carbon (DLC). The thermal conductive adhesive layer 110 may be formed solely with the material of high thermal-conductivity and high light-transmittance or formed with multiple layers of the transparent adhesive layer and the material of high thermal-conductivity and high light-transmittance by various process steps of deposition and/or spin coating. The top surface of the thermal conductive adhesive layer 110 is higher than the top surface of the substrate 100 and the height difference between the top surfaces of the thermal conductive adhesive layer 110 and the top surface of the substrate may be equivalent to or less than 400 nm, for example. In this embodiment, the buried oxide layer 102 of the SOI substrate 100 has a thickness of about 1-3 nm, for example. The material of high thermal-conductivity is defined as the material having a thermal conductivity larger than 5 $Wm^{-1}K^{-1}$, while the material of high light-transmittance is defined as the material has a transmittance greater than 80% at the operating frequencies of the laser (e.g., for infrared laser, the frequency may be at 1310 nm, 1550 nm or 850 nm etc.). The refractive index of the thermal conductive adhesive layer 110 is smaller than the reflective index of the silicon portion 101. The refractive index of the thermal conductive adhesive layer 110 is smaller than 3.5.

Figure 1C:
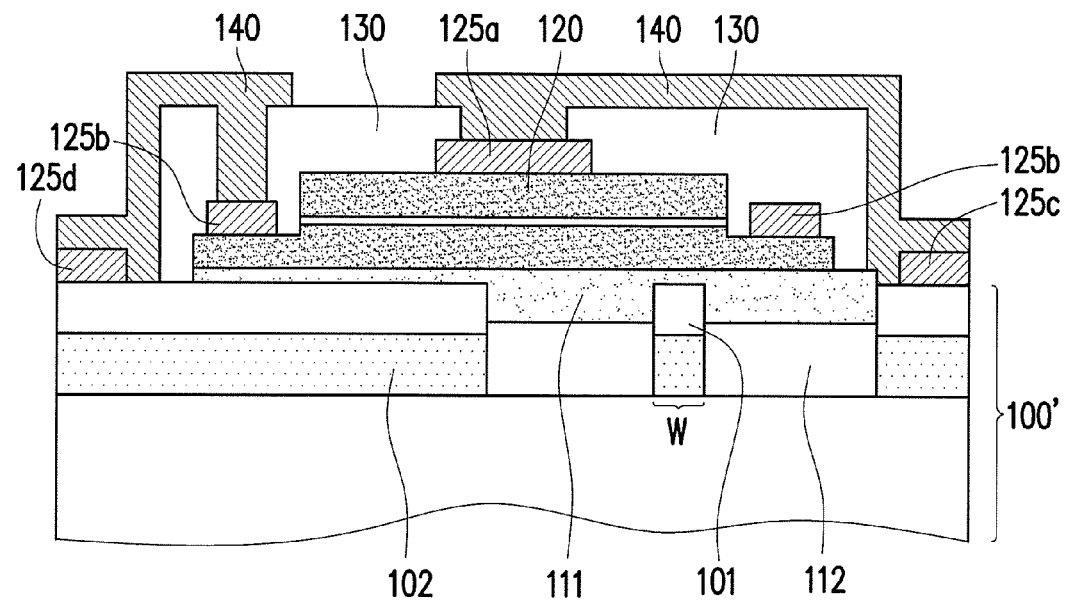
FIG. 1C is a cross-sectional view of a semiconductor laser, structure according to another embodiment of the present invention.

FIG. 1C is a cross-sectional view of a semiconductor laser structure according to another embodiment of the present invention. Different from the structure shown in FIG. 1A, the substrate 100' may be, a SOI substrate having a buried oxide layer 102 therein, for example. The SOI substrate includes at least one trench S1 formed therein and the trench S1 is filled with the adhesive layer 111 and the high thermal-conductivity material layer 112. The high thermal-conductivity material layer 112 is located at the bottom of the trench S1 and beneath the adhesive layer 111, while the adhesive layer 111 not only fills the trench S1 but also covers a portion of the substrate 100'. The electrodes 125c and 125d are disposed on the top surface of the substrate 100'. The top surface of the adhesive layer 111 is higher than the top surface of the substrate 100' and the height difference between the top surfaces of the adhesive layer 111 and the top surface of the substrate may be equivalent to or less than 400 nm, for example. In this embodiment, the buried oxide layer 102 of the SOI substrate 100' has a thickness of about 1-3 μm, for example. The high thermal-conductivity material layer 112 has a thickness equivalent to or slightly larger than the thickness of the buried oxide layer 102. The top surface of the high thermal-conductivity material layer 112 may be <50 nm higher than the top surface of the buried oxide layer 102. The high thermal-conductivity material layer 112 is made of the material of high thermal-conductivity and also defined as the material having a thermal conductivity larger than 5 $Wm^{-1}K^{-1}$, the high thermal-conductivity material may be, for example, polysilicon or aluminium nitride (AlN) produced by deposition or metal materials, such as gold (Au), silver (Ag), aluminium (Al), formed by evaporation. In this embodiment, the adhesive layer 111 may be thermosetting or thermoplastic adhesive layer, and the high thermal-conductivity material layer 112 is not an adhesive layer. The refractive index of both the adhesive layer 111 and the high thermal-conductivity material layer 112 are smaller than the reflective index of the silicon portion 101. The refractive index of both the adhesive layer 111 and the high thermal-conductivity material layer 112 are smaller than 3.5.

In FIG. 1C, the silicon portion of the SOI substrate 100' located in the region W functions as a silicon optical waveguide for the laser element 120. The heat generated from the laser element 120 can dissipate through the path which could transfer the heat through the metal line 140, to the electrodes 125c and 125d and then to the ambient environment.

Figure 1D:
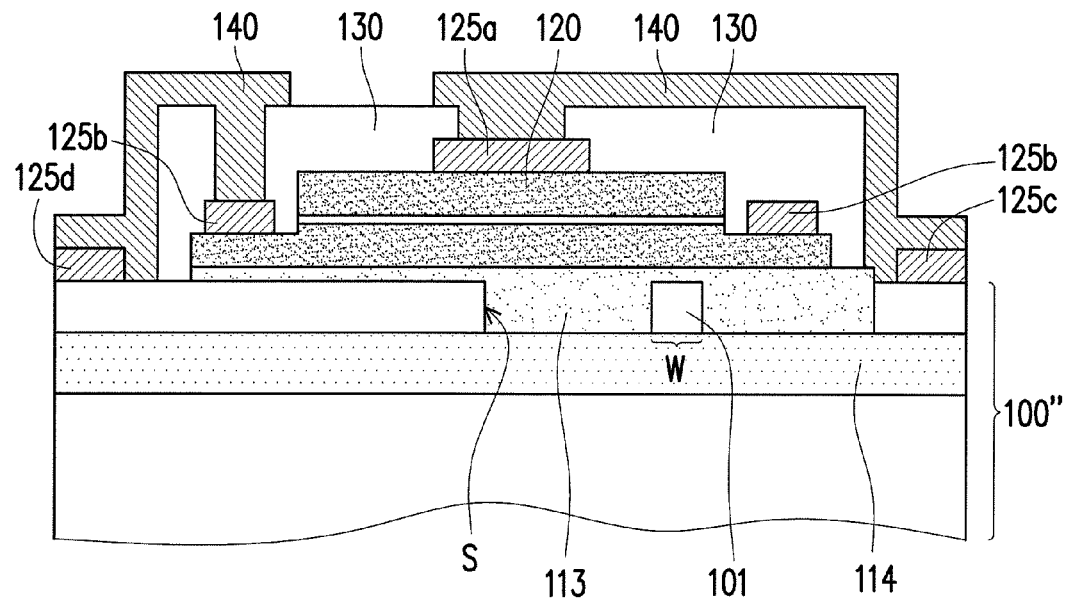
FIG. 1D is a cross-sectional view of a semiconductor laser structure according to another embodiment of the present invention.

FIG. 1D is a cross-sectional view of a semiconductor laser structure according to another embodiment of the present invention. Different from the structure shown in FIG. 1A, the substrate 100" may be, a silicon substrate having a low thermal-resistance layer 114 buried therein, instead of having the buried oxide layer 102 therein. The substrate 100" includes at least one trench S1' formed therein and the trench S1 is filled up with the adhesive layer 113. The adhesive layer 113 is located right on the low thermal-resistance layer 114, and the adhesive layer 113 not only fills the trench S1' but also covers a portion of the substrate 100". The electrodes 125c and 125d are disposed on the top surface of the substrate 100". The top surface of the adhesive layer 113 is higher than the top surface of the substrate 100" and the height difference between the top surfaces of the adhesive layer 113 and the top surface of the substrate may be equivalent to or less than 400 nm, for example. In this embodiment, the material of the low thermal-resistance layer 114, for example, may include $SiOxN1-x$, $SiNx$, AlN or $Al_2O_3$, and the low thermal-resistance layer 114 has a thickness of about 1-3 μm and functions to replace the buried oxide layer of the SOI substrate. The refractive index of the adhesive layer 113 is smaller than the reflective index of the silicon portion 101. The refractive index of the adhesive layer 113 is smaller than 3.5.

Figure 2A:
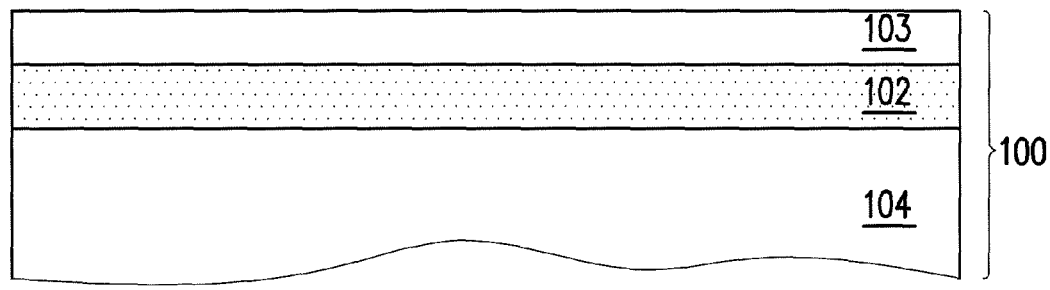
FIGS. 2A-2F are schematic cross-sectional views illustrating the process steps of the method for forming the laser structure according to one embodiment of the present invention.
Figure 2B:
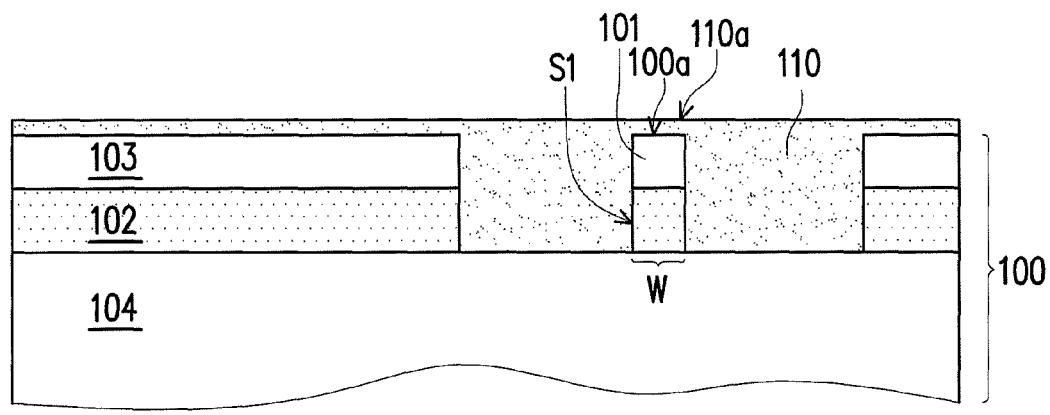
Figure 2C:
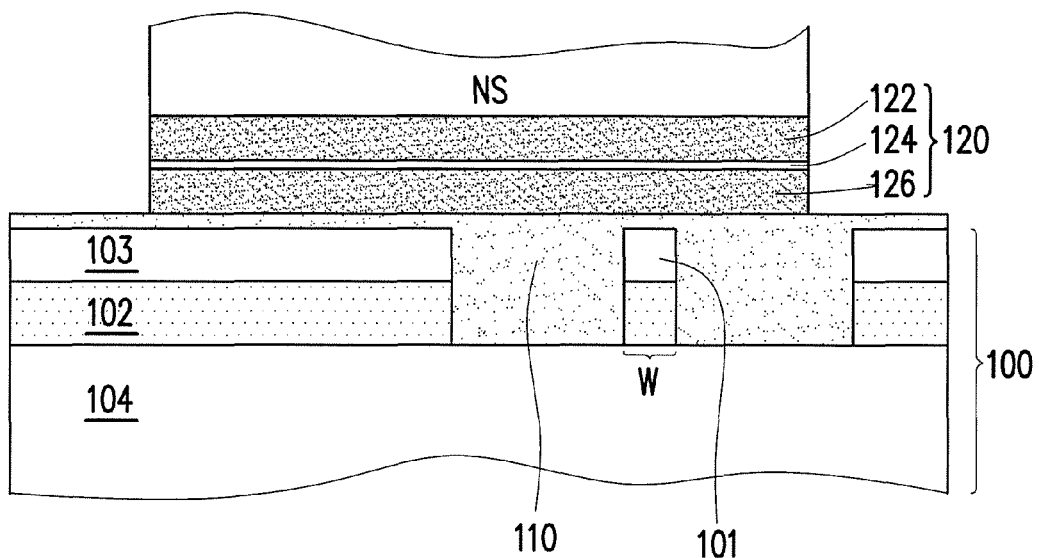
Figure 2D:
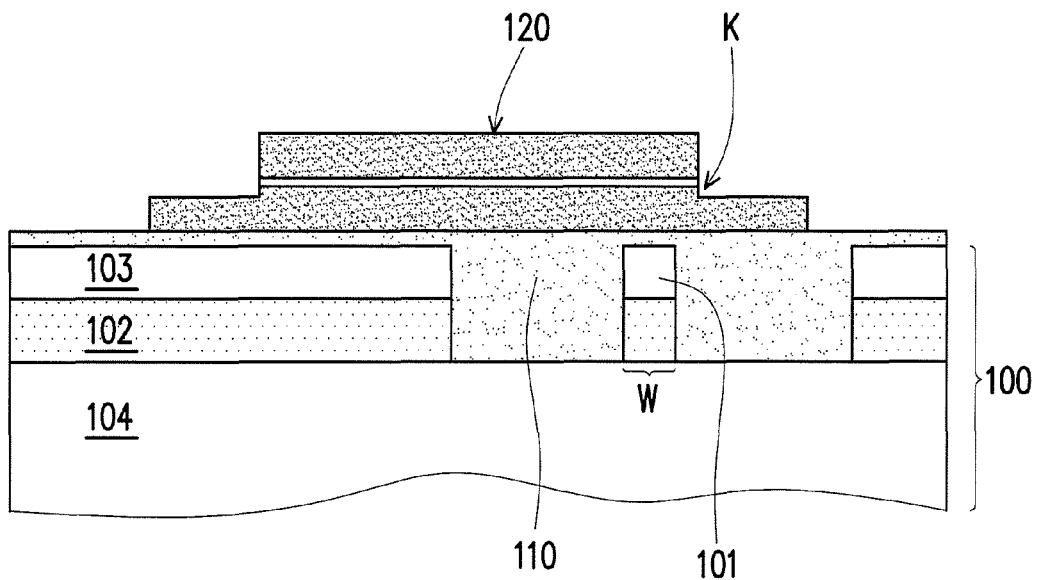
Figure 2E:
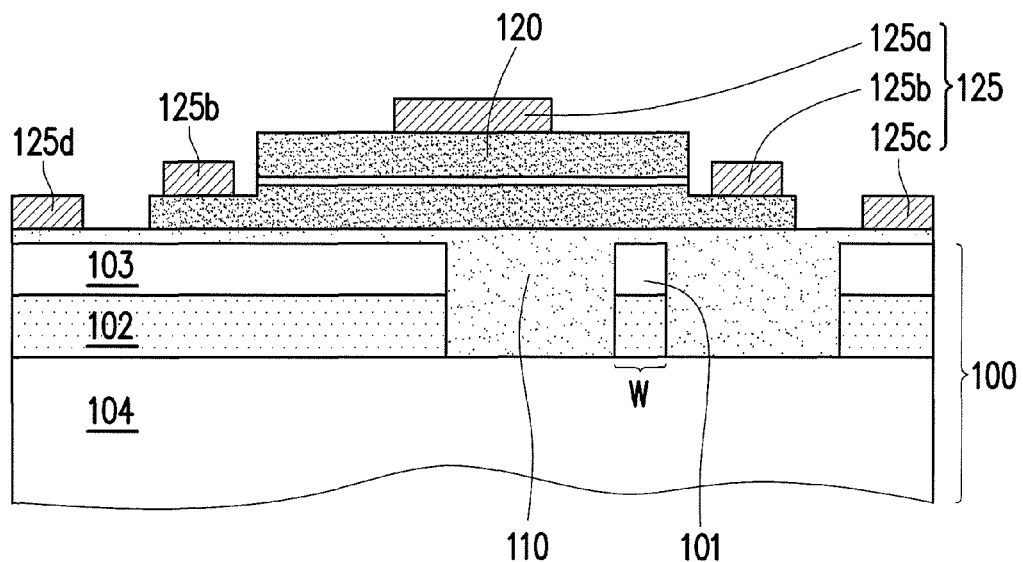
Figure 2F:
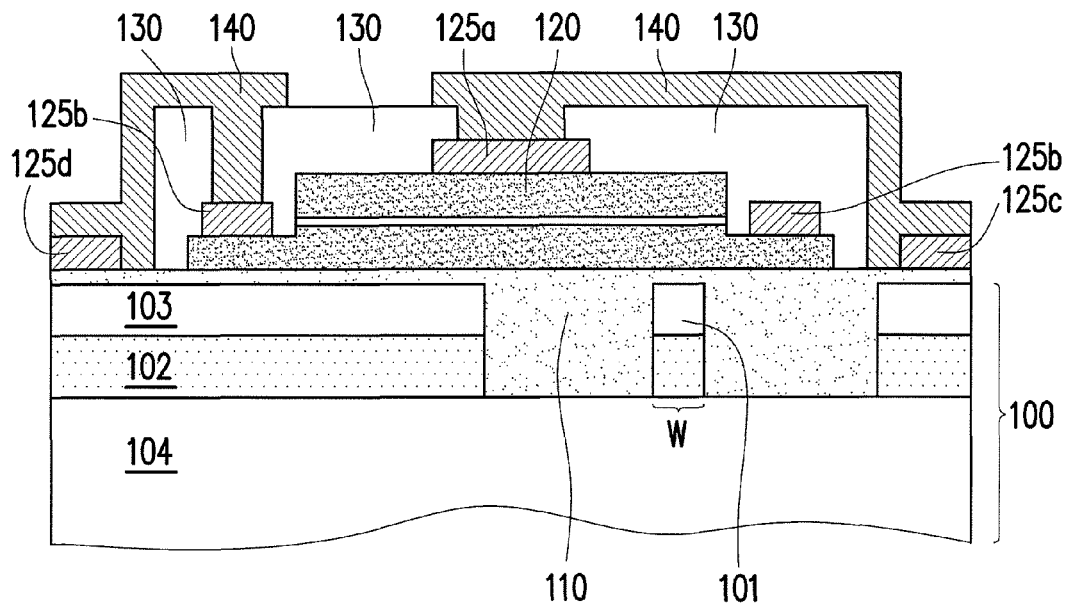

FIGS. 2A-2F are schematic cross-sectional views illustrating the process steps of the method for forming the laser structure according to one embodiment of the present invention. In FIG. 2A, a semiconductor substrate 100 having a buried oxide layer 102 buried therein and sandwiched between silicon layers 103, 104 is provided. In FIG. 2B, after patterning the substrate 100 to form the trenches S1, a thermal conductive adhesive layer 110 is formed to fill up the trenches S1 and to cover the top surface of the substrate 100. The trench S1 penetrates through the silicon layer 103 and the buried oxide layer 102. The top surface 110a of the thermal conductive adhesive layer 110 is higher than the top surface 100a of the substrate 100 for about 400 nm or less. In FIG. 2C, the laser element 120 including a p-type layer 122, a multi-quantum-well (MQW) layer 124 and an n-type layer 126 is placed on the thermal conductive adhesive layer 110 and then the laser native substrate NS is removed. In FIG. 2D, the laser element 120 is defined with the laser cavity K. Later, the electrodes 125a and 125b are respectively formed on the p-type layer and the n-type layer by evaporation, while the electrodes 125c and 125d are formed on the thermal conductive adhesive layer 110, as shown in FIG. 2E. Referring to FIG. 2F, a protection layer 130 is formed to cover the laser element 120 and portions of the electrodes 125a and 125b, exposing the electrodes 125c and 125d and portions of the electrodes 125a and 125b. The protection layer is made of an insulating material, such as silicon oxide or silicon nitride or an adhesive layer, such as BCB or polyimide. Subsequently, metal lines 140 are formed over the protection layer and electrically connecting the electrodes 125a and 125c as well as the electrodes 125b and 125d. As shown in FIG. 2F, portions of the metal lines 140 are in direct contact with the thermal conductive adhesive layer 110, which also enhance the heat dissipation by transferring heat from the laser element to the underlying thermal conductive adhesive layer 110 through the metal lines 140.

Figure 3A:
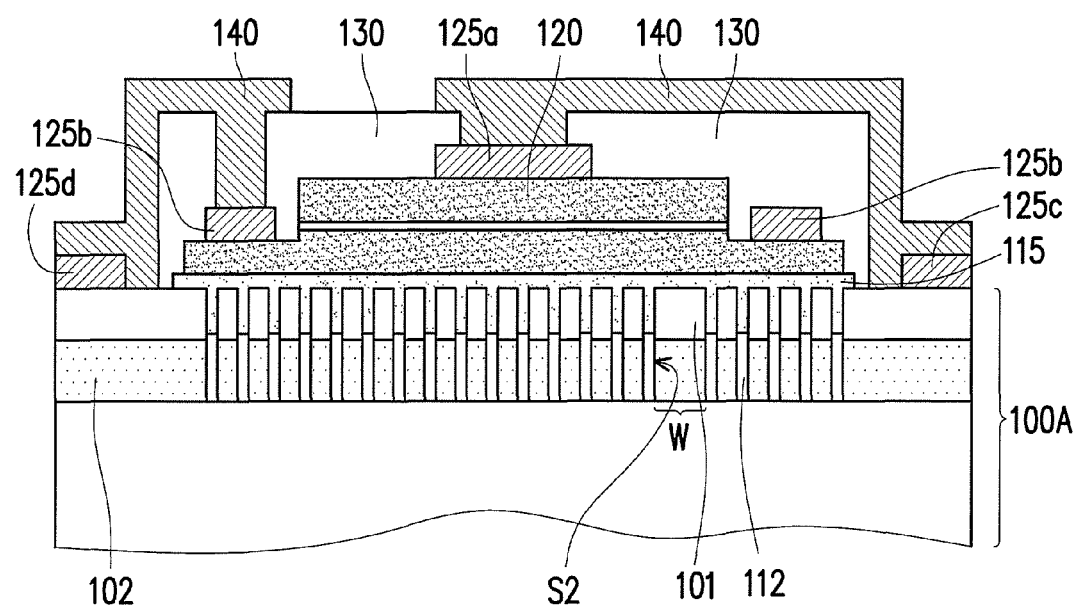
FIG. 3A is a cross-sectional view of a semiconductor laser structure according to another embodiment of the present invention.
Figure 3B:
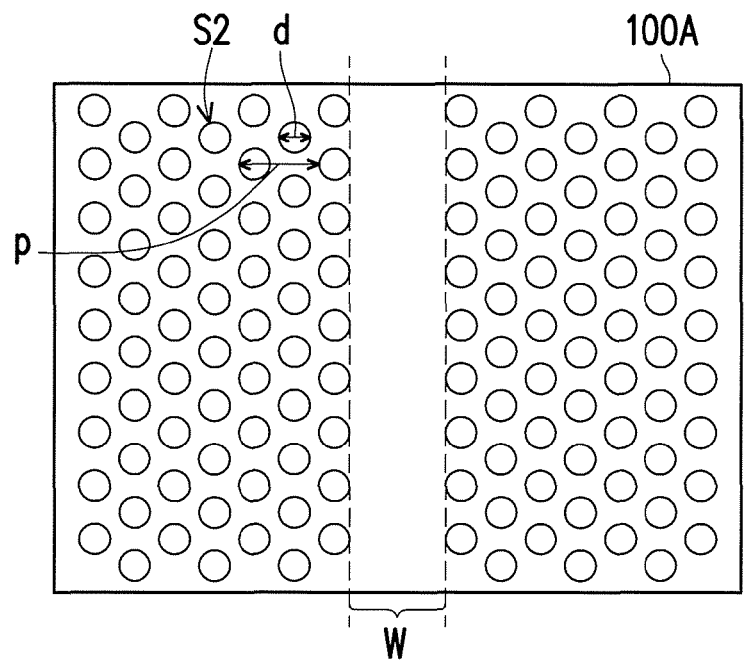
FIG. 3B is a top view showing a portion of the semiconductor laser structure of FIG. 3A around the region W according to another embodiment of the present invention.
Figure 3C:
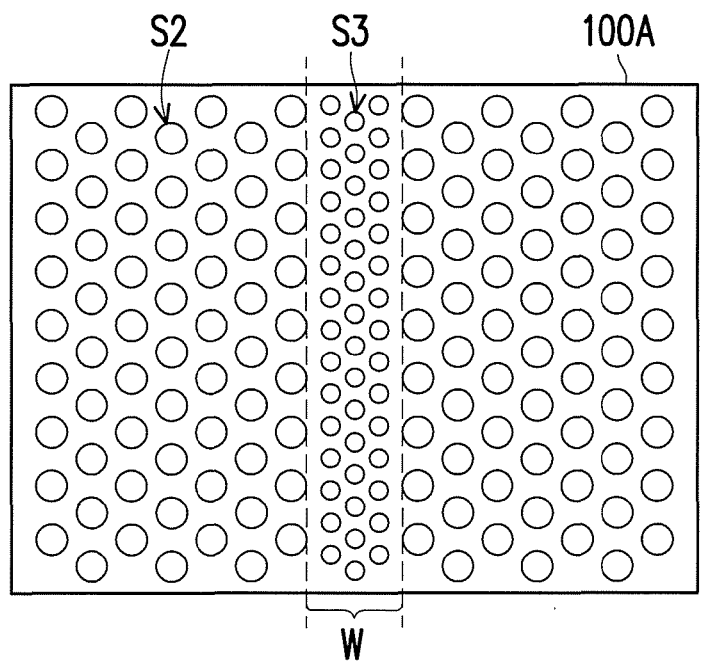
FIG. 3C is a top view showing a portion of the semiconductor laser structure of FIG. 3A around the region W according to another one embodiment of the present invention.

FIG. 3A is a cross-sectional view of a semiconductor laser structure according to another embodiment of the present invention. FIG. 3B is a top view showing a portion of the semiconductor laser structure of FIG. 3A around the region W according to another embodiment of the present invention. FIG. 3C is a top view showing a portion of the semiconductor laser structure of FIG. 3A around the region W according to another one embodiment of the present invention. Different from the structure shown in FIG. 1A, the substrate 100A may be, a SOI substrate having a buried oxide layer 102 therein, for example. Surrounding the silicon waveguide portion 101 of the SOI substrate 100 located in the region W and below the laser element 120, a plurality of holes (apertures) S2 is formed within the SOI substrate 100A and penetrating the buried oxide layer 102. Each of these holes S2 is filled with the adhesive layer 115 and the high thermal-conductivity material layer 112. The high thermal-conductivity material layer 112 is located at the bottom of the hole S2 and beneath the adhesive layer 115, while the adhesive layer 115 not only fills the hole S2 but also covers a portion of the substrate 100A. The top surface of the adhesive layer 115 is higher than the top surface of the substrate 100A and the height difference between the top surfaces of the thermal conductive adhesive layer 115 and the top surface of the substrate may be equivalent to or less than 400 nm, for example.

As shown in FIG. 3B, the holes S2 are arranged in arrays and are distributed around the region W (the silicon waveguide region). For example, the holes S2 are small apertures formed by laser drilling or photolithography, such as, inductively coupled plasma reactive ion etching (ICP-RIE). The holes S2 may be formed with a diameter d and a pitch distance p between the holes S2, a ratio d/p of the diameter d and the pitch distance p ranges from 0.2 to 0.45, and the pitch distance ranges from 0.2 μm to 1 μm, for example. By doing so, the region around the silicon waveguide region has an effective refractive index smaller than that of the silicon waveguide region, thus facilitating light propagation within the silicon waveguide.

Alternatively, as shown in FIG. 3C, in addition to the holes S2 arranged around the region W (the silicon waveguide region), a plurality of holes S3 is arranged in arrays and distributed within the region W (the silicon waveguide region). The holes S3 has a diameter (pore size) smaller than that of the holes S2. The distribution density of the holes S3 is higher than the distribution density of the holes S2. By doing so, the region around the silicon waveguide region has an effective refractive index smaller than that of the silicon waveguide region, thus facilitating light propagation within the silicon waveguide.

For the above structures, the heat generated from the laser element 120 can dissipate through the path which could transfer the heat through the metal line 140, to the electrodes 125c and 125d and then to the ambient environment.

Figure 4A:
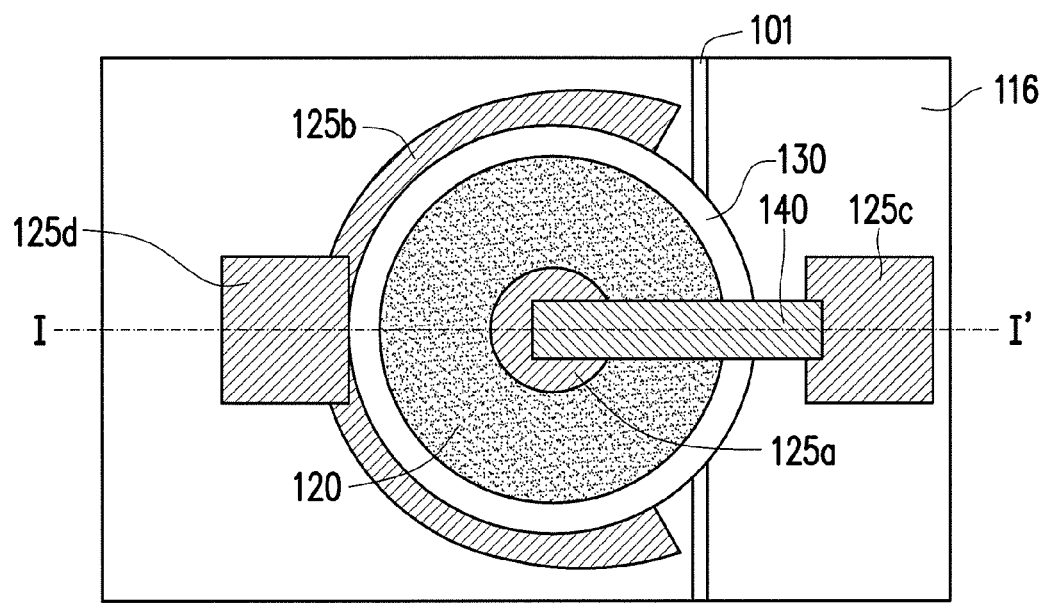
FIG. 4A is a top view of a semiconductor laser structure according to one embodiment of the present invention.
Figure 4B:
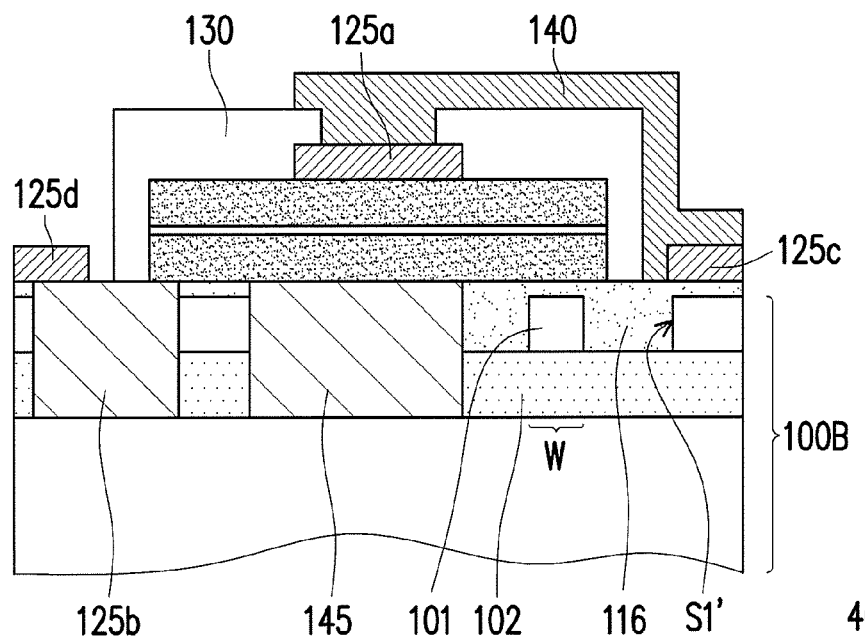
FIG. 4B is a cross-sectional view of the semiconductor laser structure of FIG. 4A.

FIG. 4A is a top view of a semiconductor laser structure according to one embodiment of the present invention. FIG. 4B is a cross-sectional view of the semiconductor laser structure of FIG. 4A. In FIGS. 4A-4B, the laser structure 40 includes a substrate 100B, an adhesive layer 116 disposed on the substrate 100B, a laser element 120 located on the adhesive layer 116, a plurality of electrodes 125a, 125b, 125c, 125d and a protection layer 130 covering the laser element 120. The laser structure 10 further includes at least one metal line 140 connecting the plurality of electrodes 125a, 125c. The electrode 125a is disposed on the laser element 120, while the electrode 125b is located below the laser element 120 and buried within the substrate 100B. The electrode 125d is disposed on the adhesive layer 116 and partially on the electrode 125b. The substrate 100B may be a SOI substrate having a buried oxide layer 102 therein and the SOI substrate includes at least one trench S1' formed therein and the trench S1' is filled up with the adhesive layer 116. The substrate 100B also includes the electrode 125b and the high thermal conductive material layer 145 formed therein. Such laser structure 40 may be called a vertical type laser structure.

The heat generated from the laser element 120 can dissipate through the electrode 125b or the high thermal conductive material 145 and then to the ambient environment.

Figure 5A:
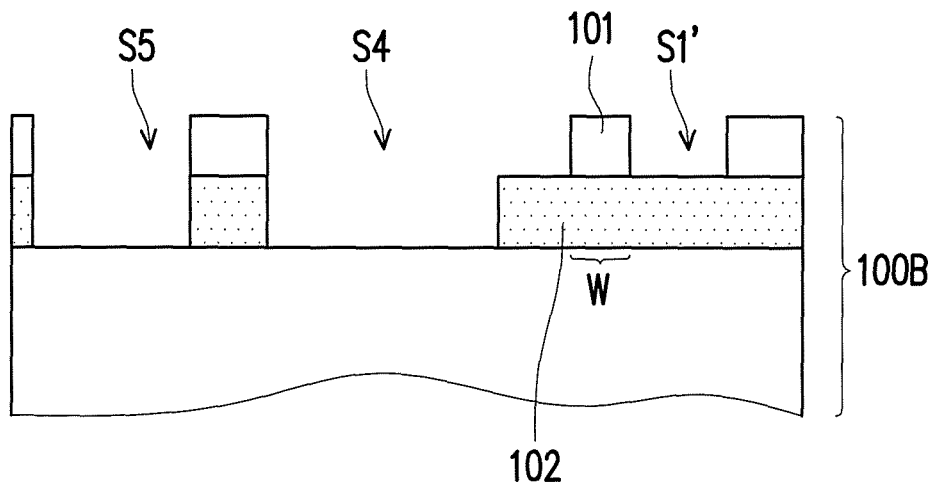
FIGS. 5A-5D are schematic cross-sectional views illustrating the process steps of the method for forming the laser structure according to one embodiment of the present invention.
Figure 5B:
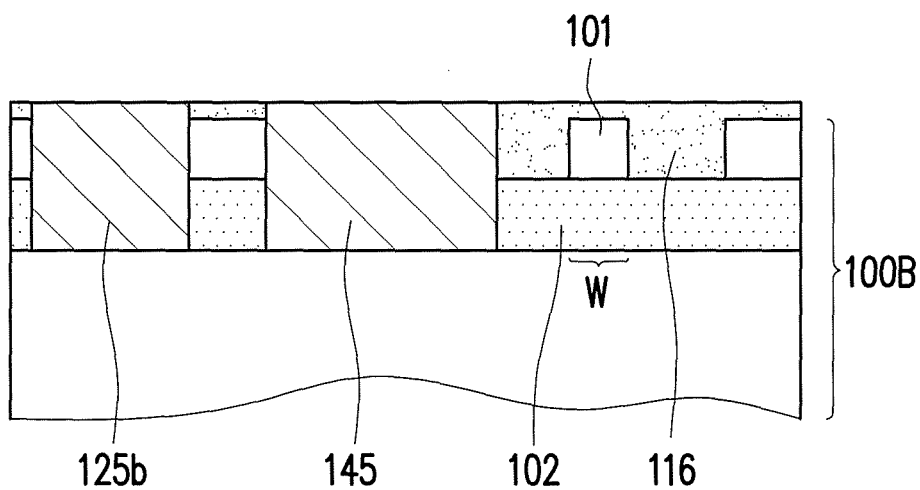
Figure 5C:
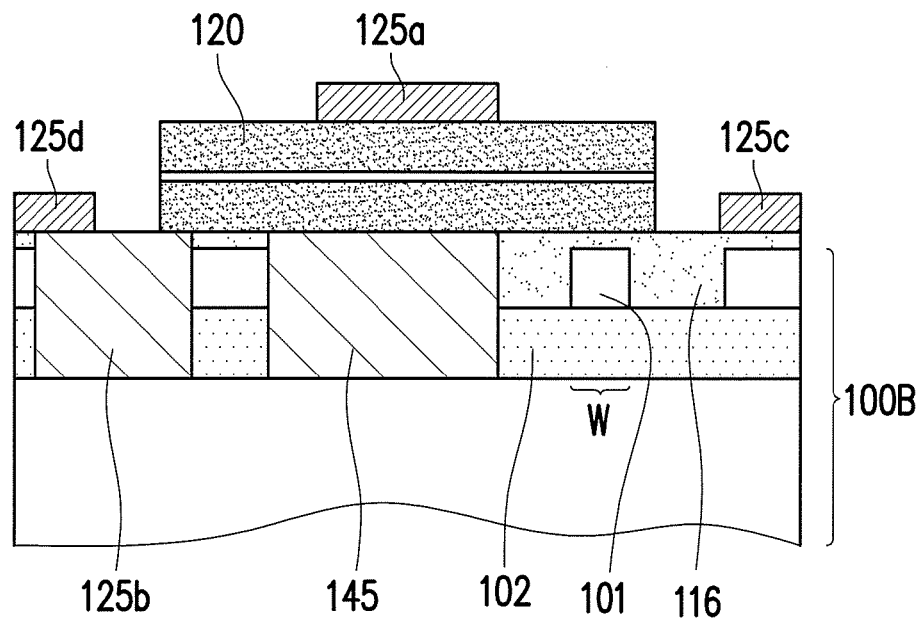
Figure 5D:
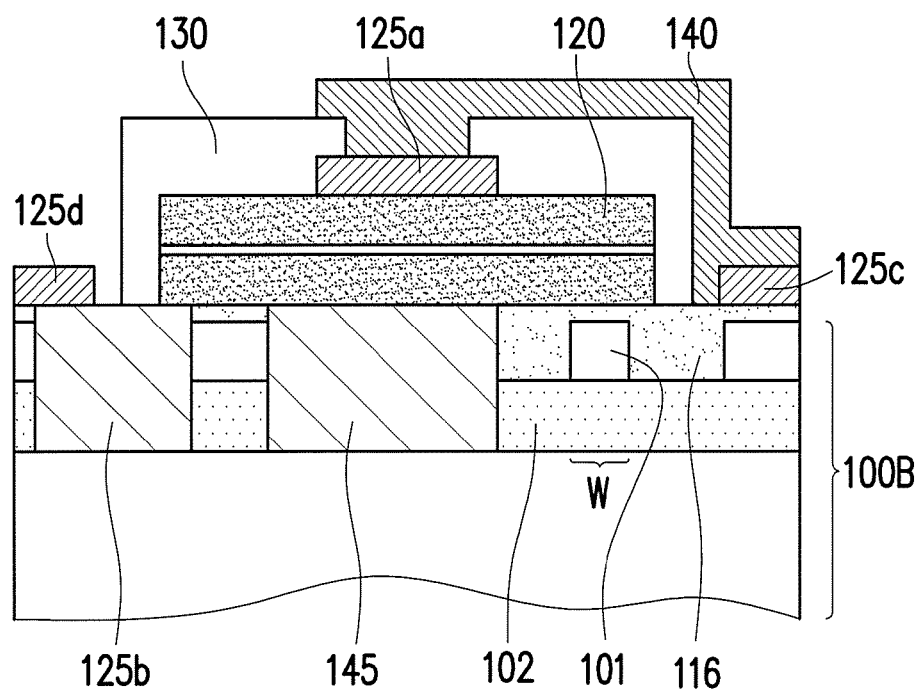

FIGS. 5A-5D are schematic cross-sectional views illustrating the process steps of the method for forming the laser structure according to one embodiment of the present invention. In FIG. 5A, a semiconductor substrate 100B having a buried oxide layer 102 therein is provided and the substrate 100B is formed with at least one trench S1', at least one trench S4 and at least one trench S5 therein. The trench S1' does not penetrate through the buried oxide layer 102 and located above the buried oxide layer 102, but the trenches S4 and S5 penetrate through the buried oxide layer 102. In FIG. 5B, the electrode 125b is formed to fill up the trench S5, while the high thermal conductive material layer 145 fills up the trench S4. The material of the electrode 125b may be, for example, a metal material or the combination of polysilicon and a metal, and the electrode 125b may be formed by filling the trench S5 with polysilicon and then a metal material therein. The material of the high thermal conductive material layer 145 may be metal materials or polysilicon, for example. The adhesive layer 116 is formed to fill up the trenches S1' and to cover the top surface of the substrate 100B. In FIG. 5C, the laser element 120 is placed on the adhesive layer 116 and the high thermal conductive material 145 and above the electrode 125b. The electrode 125a is formed on the laser element 120. One electrode 125c is formed on the adhesive layer 116, while another electrode 125d is formed on the adhesive layer 116 and the electrode 125b. Referring to FIG. 5D, a protection layer 130 is formed to cover the laser element 120 and portions of the electrode 125a, exposing the electrodes 125c and 125d and portions of the electrodes 125a and 125b. Subsequently, at least one metal line 140 is formed over the protection layer and electrically connecting the electrodes 125a and 125c, while the electrodes 125b and 125d are in direct contact with each other.

Figure 6:
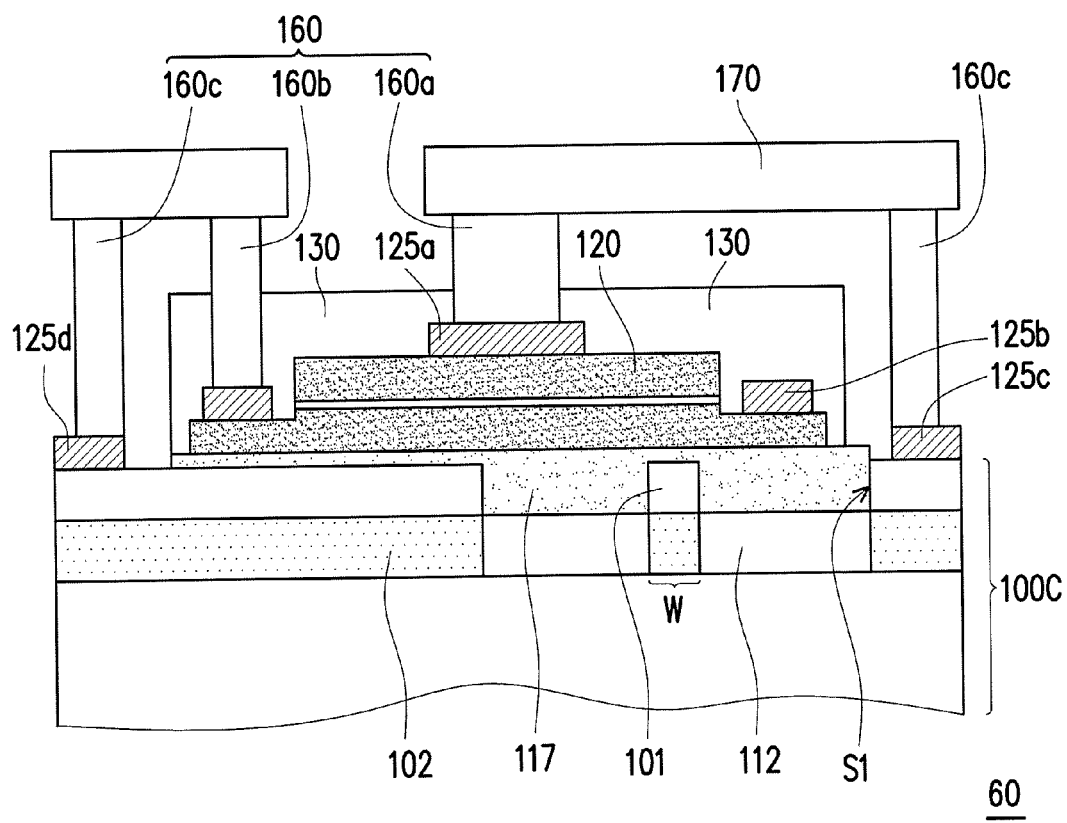
FIG. 6 is a cross-sectional view of a semiconductor laser structure according to one embodiment of the present invention.

FIG. 6 is a cross-sectional view of a semiconductor laser structure according to one embodiment of the present invention. Different from the structure shown in FIG. 1C, the laser structure 60 includes connection structures 160 and thermal elements 170, instead of the metal lines 140. The electrodes 125a, 125b, 125c and 125d are respectively connected to the thermal elements 170 through the connection structures 160a, 160b and 160c. Also, the thermal elements 170 and the connection structures 160 together function to electrically connect the electrodes 125a and 125c as well as the electrodes 125b and 125d. The connection structures 160a, 160b, 160c may be bumps made of copper-tin (Cu—Sn) alloys, gold-tin (Au—Sn) alloys, indium (In) or other materials, for example. The thermal elements may be heat plates of a high thermal conductivity substrate made of silicon (Si), gold (Au), aluminum (Al) or aluminum nitride (AlN), for example. The thermal conductivity of the high thermal conductivity substrate is defined as larger than 5 $Wm^{-1}K^{-1}$, for example. The thermal elements may be thermal sensors or other electronic components with the bonding temperature of 150° C.~300° C. The substrate 100C may be a SOI substrate having a buried oxide layer 102 therein and the SOI substrate includes at least one trench S1 formed therein and the trench S1 is filled up with the adhesive layer 117 and the high thermal-conductivity material layer 112.

Through the design the aforementioned structures and by using the material of high thermal conductivity, high light-transmittance and/or with bonding capability, better heat dissipation is offered with improved structural reliability.

Figure 7A:
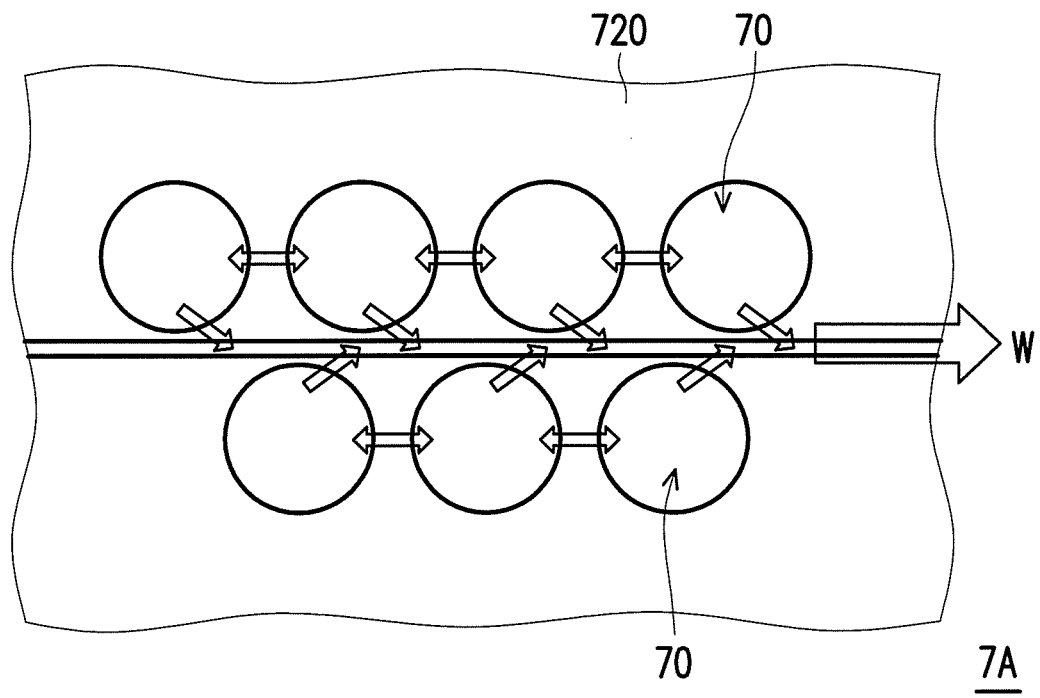
FIG. 7A is a top view of an array laser structure according to one embodiment of the present invention.
Figure 7B:
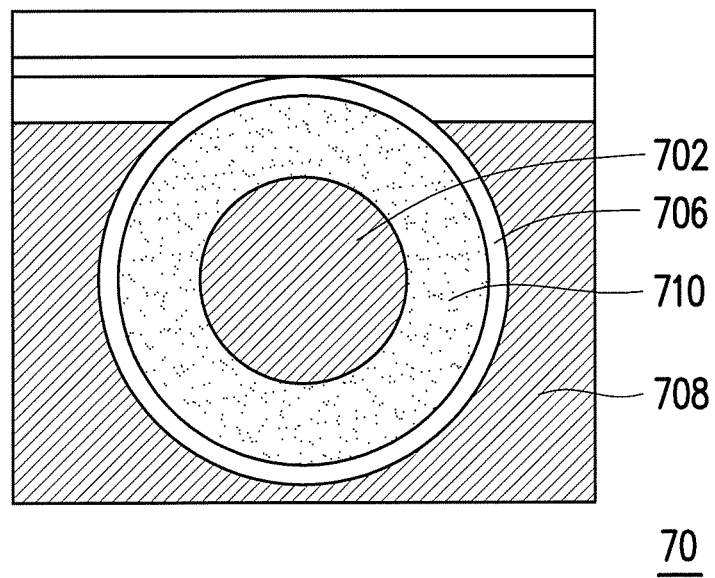
FIG. 7B is a top view of one unit micro-ring laser structure in FIG. 7A.
Figure 7C:
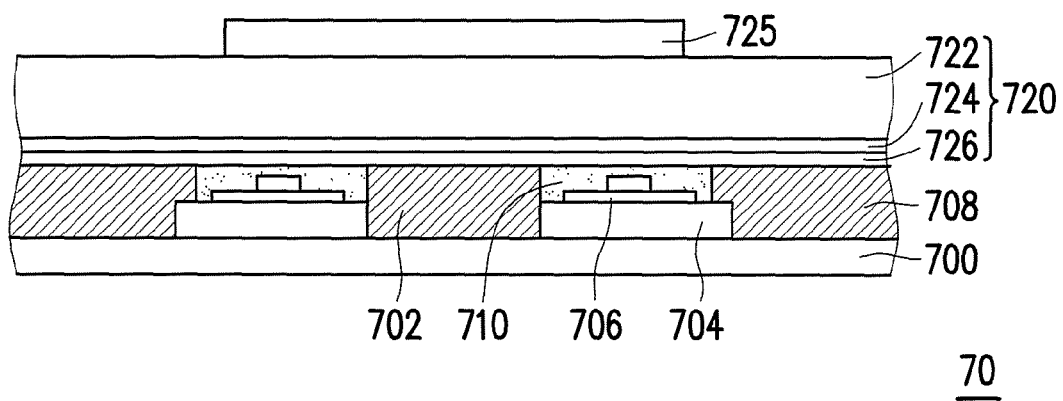
FIG. 7C is a cross-sectional view of one unit micro-ring laser structure in FIG. 7A.

FIG. 7A is a top view of an array laser structure according to one embodiment of the present invention. FIG. 7B is a top view of one unit micro-ring laser structure in FIG. 7A, without showing the upper portion (the laser element 720 and the p-type electrode 725) of the structure. FIG. 7C is a cross-sectional view of one unit micro-ring laser structure in FIG. 7A. In FIG. 7A, the array laser structure 7A includes a plurality of micro-ring lasers 70 coupled to one another and arranged in arrays. The micro-ring laser 70 can be regarded as one unit micro-ring structure. The adjacent micro-ring lasers 70 are coupled to each other and also coupled to the adjacent common silicon waveguide W (the direction of the arrow indicates the output direction). For the individual unit micro-ring structure, each unit has a radius smaller than 50 μm, and the spacing between any two most adjacent micro-ring lasers 70 is smaller than 500 nm, for example. The array laser structure 7A provides a laser resonator with a large free spectral range (FSR), larger than 5 nm. In FIGS. 7B-7C, the micro-ring laser 70 includes a central thermal shunt 702 located on the silicon substrate 700, a circular buried oxide layer 704 located on the silicon substrate 700 and surrounding the central thermal shunt 702, a ring shaped silicon waveguide 706 located on the buried oxide layer 704 and surrounding the central thermal shunt 702, a contiguous thermal shunt 708 covering a portion of the circular buried oxide layer 704 and surrounding the ring shaped silicon waveguide 706 and an adhesive layer 710 covering the ring shaped silicon waveguide 706 and the buried oxide layer 704. The thermal shunt 708 also serves as the n-type electrode. The central thermal shunt and the contiguous thermal shunt are composed of a high thermal-conductivity material. The function of the central thermal shunt and the contiguous thermal shunt is somewhat like the high thermal-conductivity material layer 112 and 145 in FIGS. 1C and 5B, and is used to dissipate the heat generate from the laser. Therefore, the material of the central thermal shunt and the contiguous thermal shunt can be polysilicon, aluminium nitride (AlN), gold (Au), silver (Ag), aluminium (Al), or the combination. The silicon substrate 700 and the buried oxide layer 704 may be considered as the SOI substrate.

The material of the thermal conductive adhesive layer 710 may be BCB, oxide, silicon nitride, and III-V material such as GaN, while the material of the ring shaped silicon waveguide 706 may be silicon, polysilicon, and the lamination of them, for example.

From the top view of FIG. 7B, the adhesive layer 710 is in a ring shape surrounding the central thermal shunt 702, while the ring shaped silicon waveguide 706 is also in a ring shape surrounding the thermal conductive adhesive layer 710. The micro-ring laser 70 also includes a laser element 720 consisting of a p-type layer 722, a multiple-quantum-well (MQW) layer 724 and a n-type layer 726, over the thermal shunts 702, 708 and the adhesive layer 710 as well as one p-type electrode 725 located on the laser element 720. From the top views of FIGS. 7A-7B, it is seen that the laser element 720 is formed as one contiguous structure over the array laser structure 7A. By doing so, the laser active layers (i.e., the laser element 720) are formed as a whole and connected to the common waveguide. Also, the laser element 720 is bonded to the SOI substrate and the thermal shunts thorough the thermal conductive adhesive layer 710, which reinforcing the bonding strength and the reliability.

Figure 8:
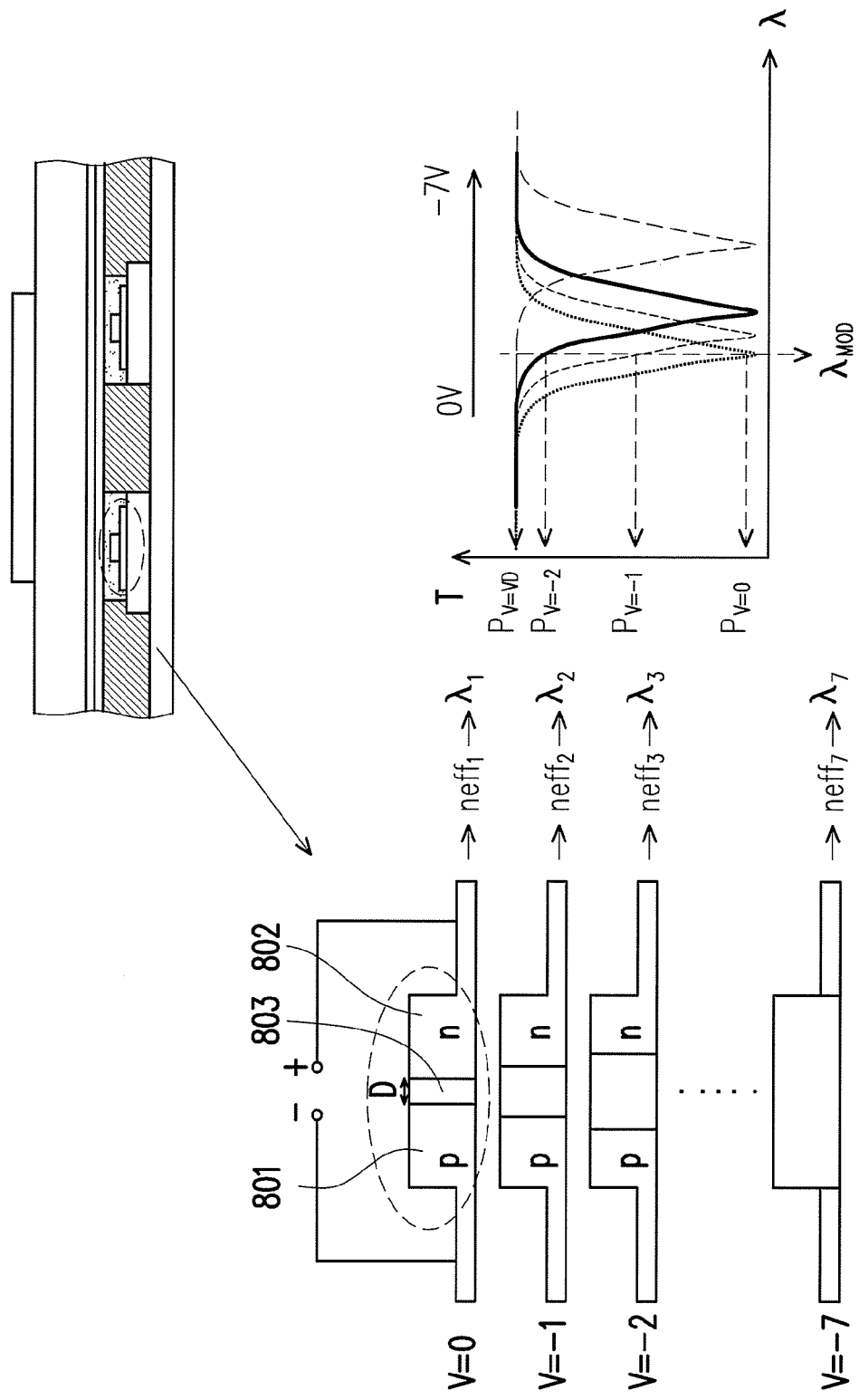
FIG. 8 shows the mechanism of wavelength adjustment for the semiconductor laser structure.

The ring shaped silicon waveguide 706 of FIG. 7B is shown in a schematic enlarged view in the left side of FIG. 8. The ring shaped silicon waveguide (silicon ridge waveguide) includes a P-N junction of the p-type material portion 801, the n-type material portion 802 and the depletion region 803 therebetween. When the applied voltage V increases (from 0V to 7V), the distance D of the depletion region 803 increases and the resonant wavelength λ (λ1 to λ7) of the waveguide increases. By changing the applied voltage, the resonant wavelength λ of the waveguide is changed, thereby altering the laser emission wavelength and compensating the wavelength shift caused by the thermal effect. As a result, the laser operation wavelength of the laser structure is stabilized. Furthermore, such mechanism can be used to fabricate the wavelength tunable laser structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor laser structure, comprising:
   a substrate having a surface layer, a bottom layer and an intermediate layer sandwiched between the surface layer and the bottom layer;
   at least one trench in the substrate penetrating through the surface layer and the intermediate layer;
   an adhesive layer on a top surface of the substrate and at least partly filling the trench, wherein the adhesive layer is benzocyclobutene (BCB) mixed with transparent thermal-conductivity material;
   a laser element disposed on the adhesive layer on the substrate;
   a plurality of electrodes disposed over the substrate and on the laser element; and
   a protection layer at least partly covering the laser element.

2. The structure of claim 1, wherein the transparent thermal-conductivity material is graphene, diamond-like carbon (DLC).

3. The structure of claim 1, further comprising a high thermal-conductivity material layer located at a bottom of the trench and beneath the adhesive layer.

4. The structure of claim 3, wherein the high thermal-conductivity material layer having a thermal conductivity larger than 5 $Wm^{-1}K^{-1}$.

5. The structure of claim 3, wherein the high thermal-conductivity material layer is composed of a material of polysilicon, aluminium nitride (AlN), gold (Au), silver (Ag), aluminium (Al), or the combination thereof.

6. The structure of claim 3, wherein the top surface of the high thermal-conductivity material layer may be <50 nm higher than the top surface of the intermediate layer.

7. The structure of claim 1, wherein the trench comprises a plurality of first holes arranged beside a waveguide region of the substrate.

8. The structure of claim 7, wherein the first holes having a diameter d and a pitch distance p between the plurality of first holes, a ratio d/p of the diameter d and the pitch distance p ranges from 0.2 to 0.45, and the pitch distance ranges from 0.2 μm to 1 μm.

9. The structure of claim 8, wherein the trench comprises a plurality of second holes in the waveguide region of the substrate, and the pore size of the plurality of the second holes in the waveguide region is smaller than the pore size of the plurality of the first holes beside waveguide region of the substrate.

10. The structure of claim 8, wherein the trench comprises a plurality of second holes in the waveguide region of the substrate, and the distribution density of the plurality of the second holes in the waveguide region is higher than the distribution density of the plurality of the first holes beside waveguide region of the substrate.

11. The structure of claim 1, further comprising a plurality of thermal elements, wherein the electrodes are respectively connected to the thermal elements through bumps.

12. The structure of claim 11, wherein the thermal elements are high thermal conductivity substrates composed of silicon (Si), gold (Au), aluminium (Al), aluminium nitride (AlN) or a the combination thereof.

* * * * *